United States Patent
Mayer et al.

[11] Patent Number: 6,074,065
[45] Date of Patent: Jun. 13, 2000

[54] POLARISER MADE FROM BREWSTER PLATES

[75] Inventors: Claus Mayer, Scharneber; Friedrich Luellau, Hamburger Strasse 17a, D-21357 Bardowick, both of Germany

[73] Assignee: Friedrich Luellau, Bardowick, Germany

[21] Appl. No.: 09/091,172

[22] PCT Filed: Dec. 6, 1996

[86] PCT No.: PCT/EP96/05473

§ 371 Date: Nov. 2, 1998

§ 102(e) Date: Nov. 2, 1998

[87] PCT Pub. No.: WO97/22021

PCT Pub. Date: Jun. 19, 1997

[30] Foreign Application Priority Data

Dec. 8, 1995 [DE] Germany .................. 195 45 821

[51] Int. Cl.[7] .................................................. G02B 5/30
[52] U.S. Cl. .......................... 353/20; 359/487; 359/501
[58] Field of Search ..................... 353/20, 122; 349/5, 349/7, 8, 9; 359/487, 488, 489, 501

[56] References Cited

U.S. PATENT DOCUMENTS

| | | |
|---|---|---|
| 3,912,920 | 10/1975 | Kubota . |
| 4,863,246 | 9/1989 | Anthon . |
| 5,748,369 | 5/1998 | Yokota ........................ 353/20 |
| 5,751,480 | 5/1998 | Kitagishi .................. 359/485 |
| 5,917,565 | 6/1999 | Suzuki ....................... 349/65 |
| 5,934,780 | 8/1999 | Tanaka ....................... 362/19 |
| 5,973,833 | 10/1999 | Booth et al. ............... 359/487 |

*Primary Examiner*—William C Dowling
*Attorney, Agent, or Firm*—Michael J. Striker

[57] ABSTRACT

A polarizer envisaged for the polarization by reflection, in particular for the polarization of ultraviolet light with large apertures comprises light-permeable, preferably plane-parallel plates which in each case are arranged at an angle to the light incident preferably parallel to the optical axis. For improving the transmission of the p-polarization and for reducing the transmission of s-polarization it is provided that that several, preferably plane-parallel plates are arranged inclined with respect to the optical axis in the same direction and in a stack, wherein the angle of incident light to the respective perpendicular of the plates lies in the region of the Brewster angle.

12 Claims, 4 Drawing Sheets

POLARISER MADE FROM BREWSTER PLATES

BACKGROUND OF THE INVENTION

The invention relates to a polarizer in particular for the polarization of ultraviolet light with large apertures, with light-permeable, preferably plane-parallel plates which in each case are arranged at an angle to the light incident preferably parallel to the optical axis.

Furthermore the invention relates to a projection apparatus and a device for the photo-mechanical manufacture of structured surface.

As polarizers for large apertures usually dichroitic foils, beam splitter cubes with dielectric layers or calcite crystals are considered. Polarization foils have the disadvantage that they absorb the large part of the incident radiation which with irradiation of a high intensity and in particular with a high UV component leads to a rapid destruction of the molecular structure of the foil. Beam splitter dice and calcite crystals are with large apertures so expensive that an economical application is excluded.

The invention thus concerns itself with a further known phenomena of the polarization of light, that is the polarization by optical refraction and reflection on refractive surfaces, in particular of preferably plane-parallel glass plates.

The light components of s-polarization and p-polarization are refracted with differing strength and reflected with differing intensity components.

For the differing intensity components the equations according to Fresnel apply from which there follows that the reflection of the p-polarization disappears at the so-called Brewster angle, the reflected light thus only comprises an s-polarization component. Also with incident angles which deviate by several degrees from the Brewster angle the reflection component of the p-polarization disappears almost completely. It is therefore sufficient when the angle of incidence lies in the region of the Brewster angle.

From GB 2 272 277 A there is known a device for the s-polarization of light by way of an arrangement of plane-parallel plates at a Brewster angle, wherein the plates stand next to one another at a large distance in order to irradiate a large as possible area of an optical display with polarized light. The large number of plates at the same times serves the enlargement of the irradiated surface. The light reflected by the plates is, after a further reflection, guided back to a mirror in the beam path in order to achieve the s-polarization.

The intensity component reflected at the Brewster angle is free from p-polarization and is therefore completely s-polarized, however only uses a smaller part of the possible intensity. With glass with a refractive index of n=2 the Brewster angle is calculated at 64° and the reflected component of the s-polarization at 64° is calculated at 36%. In comparison with this polarization foils achieve 70%, calcite crystals 95% and beam splitter dice even 98%.

If in contrast one wishes to use the component of p-polarization transmitted at 100% (theoretically) at the Brewster angle, then one has the disadvantage that also a larger part (in our example with only one refractive surface: 64%) of the s-polarization is transmitted. One therfore has in the transmitted beam not even an approximate complete polarization.

SUMMARY OF THE INVENTION

It is the object of the invention to improve a polarizer of the type initially mentioned such that with a simple and compact construction it has a higher contrast.

This object is achieved according to the invention in that several, preferably plane-parallel plates are arranged inclined with respect to the optical axis in the same direction and in a stack, wherein the angle of incident light to the respective perpendicular of the plates lies in the region of the Brewster angle.

On passing through the individual plates of the plate stack the light component with p-polarization is in each case transmitted at 100% (ignoring the absorption effects), it thus, on passing through the whole stack, is not subjected to any considerable weakening if the number of plates is not too large. From the light component with s-polarization on each plate a smaller part is reflected and thus removed from the beam path. The larger the number of plates the smaller is the remaining component of s-polarization and thus the more complete is the polarization of the transmitted beam.

A further formation of the invention envisages that the plates within the stack are arranged at slightly different angles in a compartmental manner and/or the plates comprise a wedge-shaped cross section. This measure has the advantage that the s-polarization components reflected to and fro between the plates laterally leaves the plate stack after a few reflections and are deflected out of the beam path more completely. In this way fewer plates are required in order to reduce the remaining intensity of the s-polarization in the transmitted beam to a tolerable measure. In an analogous manner it also functions when the plates themselves are wedge-shaped. Most effective is when the gap as well as the plate is formed wedge-shaped.

This embodiment form may be even further improved in that the plates in the direction of the incident light are arranged progressively in each case at reducing angles to the optical axis. Each transmitted beam which has undergone two reflections—thus in particular the overriding component of the transmitted beams with s-polarization—here runs at an angle to the optical axis which is double as large as the angular difference of the successive plates taking part. On each further plate which according to the invention encloses an even smaller angle with the optical axis, the beam transmitted once again is mainly reflected wherein its angle to the optical axis enlarges rapidly until it finally after a few plates laterally exits the plate stack.

In particular it is also the case that each transmitted beam which has undergone at least one reflection leaves the plate stack at an angle to the optical axis which is at least as large as double the angular distance of the two applicable or neighbouring plates of the stack. One may use this circumstance in order to increase the degree of polarization, in particular when the incident beams are collimated. For this one selects the angular difference of the two neighbouring plates of the plate stack larger than half the angle of acceptance of an optical arrangement subsequent in the beam path, with the result that all transmitted beams which have at least undergone one reflection in the plate stack may not pass through the optical arrangement. Only the beams transmitted directly without relection, with which the p-polarization significantly predominates, get into the further beam path.

Particularly good results with the compartment-like plate stacks are achieved when the angular difference of two neighbouring plates is at least 2°, in particular is between 4° and 6°.

In an alternative formation of the invention it is provided that two, preferably plane-parallel plates are arranged inclined with respect to the optical axis in opposite directions, wherein the respective perpendiculars of the plates essentially are at a Brewster angle to the optical axis. This arrangement has the advantage that both plates may be inclined at the Brewster angle with any accuracy and in spite of this only the beams transmitted directly without reflection remain in the collimated beam path.

If the two plates are inclined in exactly opposite directions there results a further advantage. A displacement of the beam path caused by the first inclined-standing plate, which has the result of a focus displacement, is completely removed by the second oppositely inclined-standing plate. With the application in a focussed beam path the parallel displacement is dependent on the angle of incidence and thus on the distance to the optical axis. In contrast to a compartment-shaped arrangement in which the displacements add up, in this arrangement they compensate one another, even if not completely. This improves the quality of imaging.

A symmetrical beam path and a compact arrangement of the polarizer is obtained in that one of the two plates is divided into two plate parts and that the two plate parts together with the other undivided plate are arranged X-shaped.

An opaque region (dark strips) occuring at the seam location of the X-shaped arrangement may be approximately halved in width if the two plate parts are arranged out of the common plate plane in each case towards the optical axis slightly parallely displaced.

The dark strips disappear completely when the two plate parts on their narrow sides lying nearest the undivided plate are provided with a chamfer, wherein they are no longer arranged parallely displaced.

Since on the application in a focussed beam path the angle of incidence is dependent on the distance to the optical axis, which correspondingly influences the polarization effect it is particularly advantagous when the polarizer comprises a curvature such that the angle of incidence of the light falling convergently onto the plate is formed constant independent of the location. Such a polarizer may according to optical requirements be curved in one dimension as well as two dimensions. Two such polarizers may be arranged X-shaped, wherein the previously mentioned advantages may be achieved.

With a particular advantage the concept according to the invention is realized in combination with a projection apparatus which comprises a light source, a picture producing unit and imaging optics, wherein the picture producing unit is formed as a liquid crystal screen with a first polarizer arranged prior in the beam path and a second polarizer, the analyser arranged behind.

Such projection apparatus are for example used for the projection of video pictures wherein the brilliance of the projection picture may be improved by a component of ultra-violet light in the beam path.

Furthermore one uses such projection apparatus in devices for the photo-mechanical manufacture of structured surfaces, for example for exposing printing plates, where in particular they are incorporated into a traversable exposure head.

Such a device is known from WO 95/22787. With the known device offset printing plates are exposed in that the sample is electronically disaggregated into part pictures and the part pictures after one another are so represented on a liquid crystal screen and imaged on the printing plate that the imagers unify to a complete picture. At the same time the exposure head is traversed from one exposure head to the next, whilst simultaneously the representation on the liquid crystal screen is changed from one part picture to the next.

For exposing the whole printing plate a large number of part pictures must be exposed. With this the total exposure time for the complete exposure of the printing plate is unacceptably lengthened.

As a rule the exposure time may be reduced in that for the exposure higher light intensities are employed. Higher light intensities however with a compact construction of the exposure head lead to a heat burden which cannot be tolerated, in particular if for the required polarization of the light incident in the liquid crystal screen a polarization foil is used. As has already been mentioned such polarization filters for the most part let through a part of the incident light with the desired polarization direction, whilst the remaining part with the undesired polarization direction is absorbed. With high light intensities there thus arises in the polarization filter a considerable quantity of heat which must be removed in order to prevent a destruction of the polarization filter.

If then at least the first polarizer of such a projection apparatus is designed according to the present invention then at least an essential component—as a rule roughly half—of the intensity of the incident light (with the undesired polarization direction) not used for the imaging is deflected out of the beam path by reflection. On the other hand the light component (with the desired polarization direction) which can be used for the imaging is essentially transmitted.

Since less absorption takes place the formation according to the invention ensures a low thermal burden of the polarizer. The light which is deflected out is absorbed outside of the picture producing unit at another location where the deposited heat has a less damaging effect.

As a result of the invention higher light intensities may be used. The projection apparatus may thus produce a brighter and more brilliant projection picture. With an exposure device the exposure times may be reduced. The contrast is improved.

The projection apparatus according to the invention, which comprises a polarizer consisting of plates arranged compartmental-like at a reducing angle to the optical axis may be even further improved in that the angular difference between each two plates of the compartment-like arrangement is larger than half the acceptance angle of the imaging optics. In this manner it is ensured that only beams transmitted directly without reflection may pass the imaging optics.

In a simple formation of the projection apparatus the second polarizer consists of a polarization filter in the form of a foil. In the region of the second polarizer the advantage of a small constructional space of the polarization filter becomes more important than the additional heat production by absorption which furthermore is here considerably smaller than with the first polarizer. One however obtains better contrast values when also for the second polarizer the form according to the invention is chosen.

The contrast is even further improved when the liquid crystal screen is inclined to the optical axs at an angle which corresponds to the angle of the best transmission, in particular the surface perpendicular of the liquid crystal screen is inclined between 3° and 6° with respect to the optical axis.

In one formation of the projection apparatus which is particularly suitable for application in an exposure head it is provided that the light source comprises a metal halogenite lamp, a reflector and a collimator. The UV component which alone is effective for the exposure is high, whilst the non-usable spectral region comprises a relatively low intensity. From this there results a lower heat burden of the subsequent picture producing unit. The reflector and collimator permit the use of a large spacial angle component of the light irradiated by the lamp so that less unused light is converted into heat.

In one advantageous embodiment form, in the beam path between the light source and the picture producing element there is arranged a UV-permeable filter. Such a filter keeps back further light intensity in the non-usable spectral region so that it does not fall into the picture producing unit and may not contribute to the heat burden of the picture producing unit.

The UV-permeable filter however absorbs the light in the spectral region which is not let through, wherein the light energy is not converted in the picture producing unit but in the UV filter. For alleviating this disadvantage as an alternative in the further formation of the invention it is suggested that between the light source and the picture producing element there is arranged a UV-permeable optical element which reflects a considerable part of the light intensity in the non-usable spectral region. Advantageously by way of this the heat production in the optical element is reduced. The non-usable reflected light may be absorbed at a different location where the heat produced with this no longer disturbs.

The exposure head according to the invention may be further improved by a cooling fan. The cooling fan advantageously provides for an effective removal of the deposited heat.

BRIEF DESCRIPTION OF THE DRAWINGS

Further advantages and details of the invention result from the subsequent description of embodiment examples by way of the drawings.

The figures show individually.

DETAILED DESCRIPTION OF THE INVENTION

Figure 1:
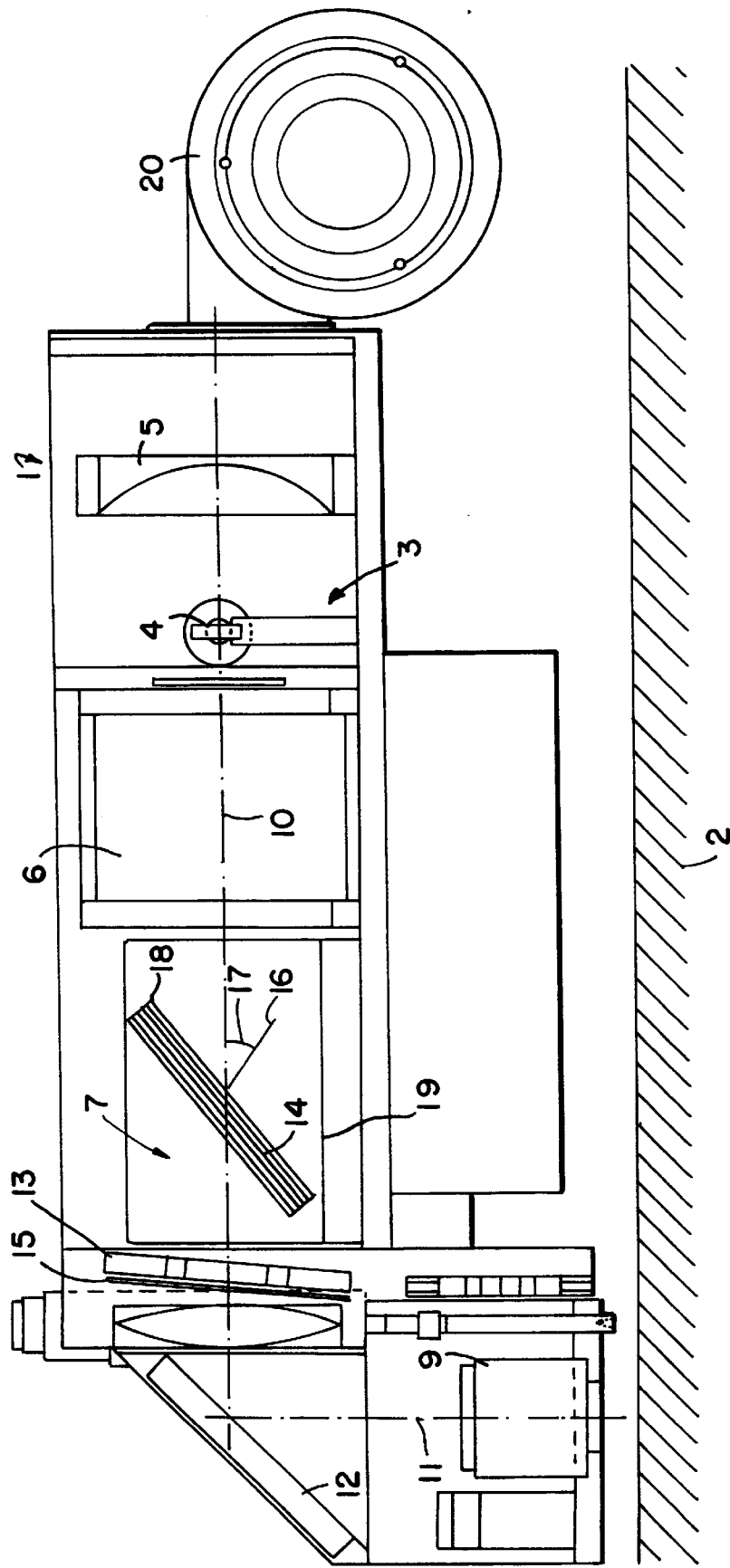
FIG. 1: a partly sectioned representation of an exposure head formed according to the invention.

In FIG. 1 one recognises an exposure head 1 which by way of a device not shown is arranged motorically traversable on an underlay 2. The exposure head 1 comprises a light source 3 which consists of a metal halogenite lamp 4, of a reflector 5 and of a collimator 6. The collimator 6 contains lens optics which are not shown and which align the light provided for the exposure largely parallel. Furthermore the exposure head 1 comprises a picture producing unit 7 or 8 and imaging optics 9 by way of which the picture sample produced in the picture producing unit 7 can be projected and imaged onto a printing plate, which is not shown, on the underlay 2 in a reduced scale. For an improved handling the exposure head 1 is arranged lying essentially over the underlay 2. The light used for the exposure originally has a beam path with a horizontal optical axis 10. For the imaging on the underlay 2 an optical axis 11 of the imaging optics 9 is aligned vertically. For the deflection of the beam path from the horiontal into the vertical a mirror element 12 is provided.

The picture producing unit 7 consists of a liquid crystal screen 13, a first polarizer 14 arranged in front in the beam path and a second polarizer 15 arranged therebehind in the beam path. The first polarizer 14 functions according to the principle of reflection in the Brewster angle. It is subsequently described in more detail.

The polarizer shown in FIG. 1 consists of a stack of plane-parallel plates which is arranged and fastened obliquely in the beam path in a manner such that a perpendicular 16 on each plate surface roughly forms the Brewster angle 17 with the optical axis 10. This arrangement has the result that in the beam path after the first polarizer 15 essentially only polarized light falls on the liquid crystal screen 13. The light which is not let through by the first polarizer 14 is not used for the exposure of the printing plate. It is refelected on the surfaces of the plane-parallel plates and largely on the first surface 18 and falls essentially on a lateral wall 19 where it is essentially absorbed. The heat arising on the lateral wall may be relatively simply removed. For an adequate heat removal there is provided a blower 20 mounted laterally on the housing of the exposure head 1.

The light polarized by the first polarizer 14 enters through the liquid crystal screen 13 which, according to the picture sample to be imaged, rotates the polarization plane of the incident light in certain surface regions to a greater or lesser degree. The thus modified light bundle then falls on the second polarizer 15 which in accordance with the rotation of the polarization plane produces a light-dark pattern in the surface regions concerned. In this way the picture sample is suitable for the imaging on the printing plate via the mirror element 12 and by way of the imaging optics 9.

The second polarizer 15 consists of a usual polarization filter in the form of a foil. Although with such a polarization foil there again arises the disadvantage that the light which is not let through is absorbed and thus heat is produced, however the light intensity to be absorbed at the second polarizer 15 is very much lower than that at the first polarizer 14 so that the produced heat quantity here is still tolerable, in any case does not always or not in all cases warrant the expense for the arrangement of a stack of plane-parallel plates as with the first polarizer 14.

In the beam path between the metal halogenite lamp 4 and the liquid crystal screen 13 advantageously there may be arranged a UV-permeable filter or a UV-permeable optical element which removes a considerable part of the light intensity in the non-usable spectral region from the beam path and at the same time reduces the heat loading of the subsequent optical elements, in particular of the liquid crystal screen and of the second polarizer.

Figure 2:
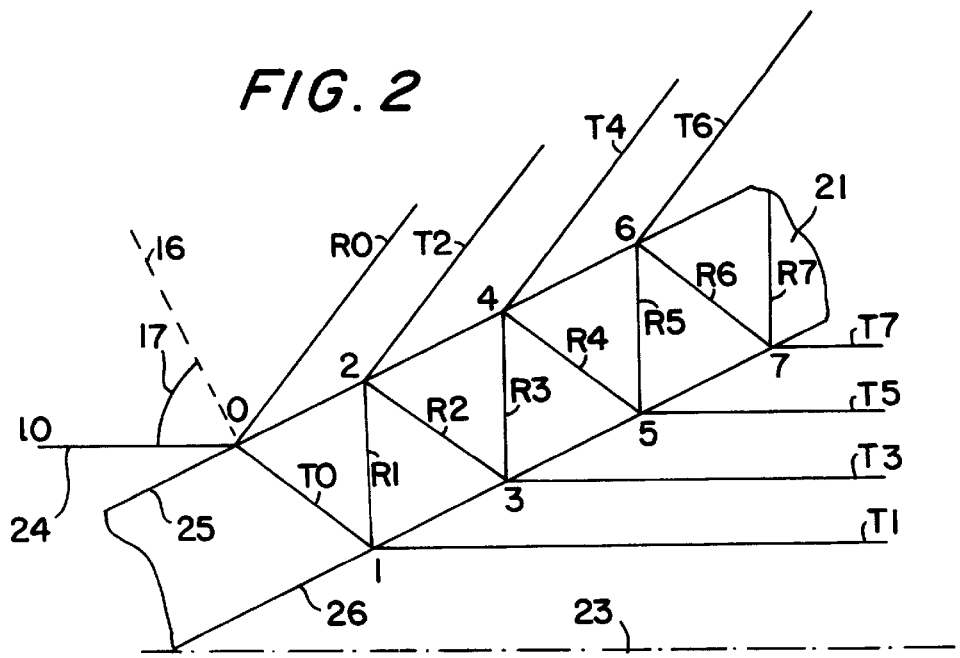
FIG. 2: transmission and reflection on a plane-parallel plate.

In FIG. 2 the situation of transmission and reflection of the light component with s-polarization on a plate 21 is illustrated. A beam 24 incident parallel to the optical axis 23 with an intensity $I_0$ hits a location 0 on the surface 25 of the plate 21 where it splits into two part beams. At the air-glass transition of the surface 25 a part beam with the intensity $R_0$ is reflected and in the ideal case laterally exits the region of the polarizer 14. Another part beam is refracted and transmitted with the intensity $T_0$.

The transmitted part beam hits the location 1 on the oppositely lying surface 26 of the plate 21 which here represents a glass-air transition, and is split into further part beams. A part beam thereof is refracted—this time in the opposite direction—and exits the plate 21 parallel to the optical axis 23 with the intensity $T_1$. The other part beam is reflected back into the inside of the plate 21 until it again hits the surface 25 at the location 2, which this time represents a glass-air transition. Also here again a part beam with the intensity $T_2$ is transmitted and refracted, so that it may exit the polarizer parallel to the first reflected part beam $R_0$.

As one easily recognises from FIG. 2 the remaining part beam at the locations 2 and 7 are again and again reflected to and fro between the surfaces 25 and 26 of the plate 21, wherein its intensity from $R_2$ to $R_7$ and further beyond decreases. With this in total the part beams $R_0$ and $T_2$, $T_4$, $T_6$, . . . (all with even numbers are deflected out of the beam path, whilst the part beams $T_1$, $T_3$, $T_5$, $T_7$, . . . (all with odd numbers) remain in the beam path and can reach the next plate of the plate stack. In this manner there arises a disadvantageously non-uniform intensity distribution.

A p-polarized beam which hits the plate 21 at the Brewster angle 17 to the perpendicular 16 is not split into part beams since the intensities of the reflected part beams disappear. In this case the incident beam at the locations 0 and 1 in each case is only refracted and exits the plate 21 with (essentially) unreduced intensity.

In a theoretical computation of the remaining intensity of the s-polarization one may add up the part intensities exiting the surface 26 of the plate 21. With a refractive index of n=2 there results the computation that about 47% of the intensity passes through the plate 21. Since (in the ideal case) 100% of the p-polarization is transmitted, the ratio of p-polarization to s-polarization after the passage is somewhat more than 2:1.

In a plate stack, with which all plates are aligned at the same angle, there are further reflections between the plates so that with respect to the intensity of the s-polarization exiting the plate stack there arises a much more complicated situation. One may therefore not simply extrapolate from a plate on the plate stack. Under further idealized assumptions one may however estimate that about 88 plates would be necessary in order to improve the above mentioned ratio to 100:1.

Figure 3:
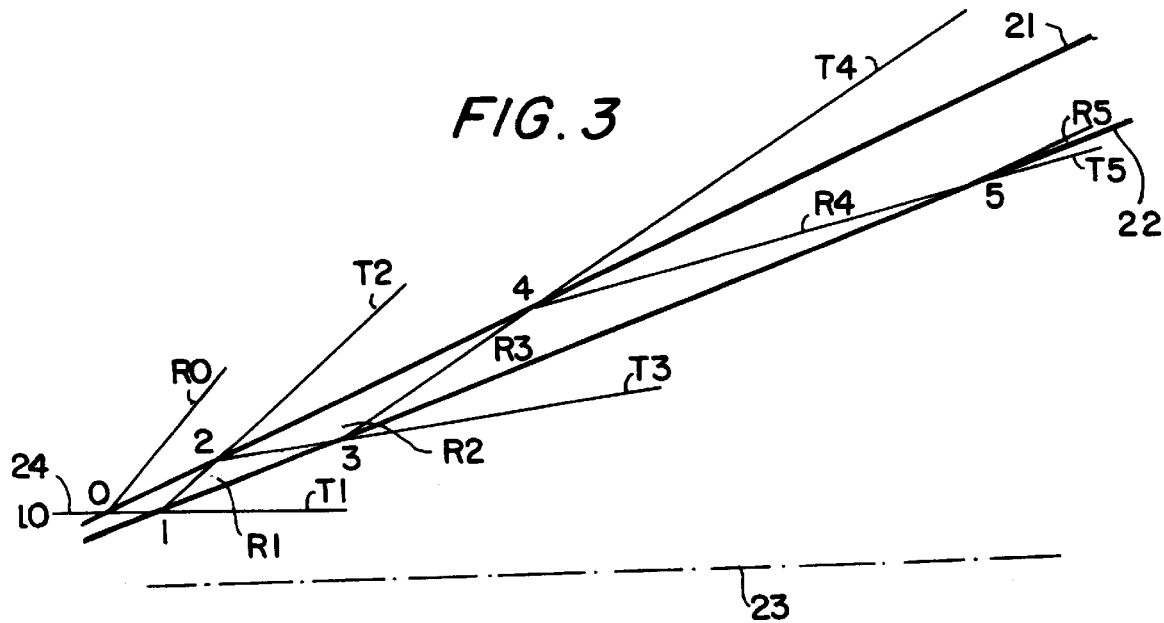
FIG. 3: transmission and reflection with two plates inclined against one another.

An improved possibility for reducing the intensity component of the s-polarization is represented in FIG. 3. Here two plates 21 and 22 are set up at slightly different angles to the optical axis 23. A beam 24 incident from the left parallel to the optical axis 23 with the intensity $I_0$ at the location 0 enters through the first plate 21 and at the location 1 through the second plate 22, wherein in each case it is slightly displaced parallely. A part beam $R_1$ is also reflected at the location 1 and at the location 2 again hits the first plate 21 where again a part beam $R_2$ is reflected to the second plate 22. The reflection between the plates 21 and 22 continue at the locations 3, 4, 5, . . . with the part beams $R_3$, $R_4$, $R_5$.

Since the plates 21 and 22 are not arranged parallel to one another the angles between the plates 21, 22 and the reflected part beams from one reflection to the next get smaller and smaller, wherein the distances between the reflection locations increase. After a finite number of reflections the angle of reflected beams lies in the region between the angles of the first plate 21 and the second plate 22 so that the beam may laterally exit the plate stack. In this way a further intensity component of the s-polarization is removed from the subsequent beam path.

If one then arranges all plates in a plate stack at slightly different angles, wherein the angle to the optical axis 23 reduces from one plate to the next, then there results for the beams $T_2$, $T_4$, . . . "transmitted back" at the locations 2, 4, . . . the same situation as for the described reflected part beams $R_1$, $R_2$, $R_3$, $R_4$, $R_5$, . . . : they exit the polarizer 14 after numerous finite reflections.

But also the part beams $T_3$, $T_5$, $T_7$, . . . passing through the last plate 22, which on passing through the plate stack have undergone at least one double reflection, may be removed in a simple manner from the further beam path since due to the reflection at the locations 2, 4, . . . they no longer run parallel to the optical axis 23. The (minimal) angle to the optical axis is after a one-off reflection at the location 2 double as large as the angular difference of the two concerned plates 21 and 22, after a reflection several times, correspondingly larger.

If one then selects the angular difference between two neighbouring plates larger than the angle of acceptance of for example 4° of the subsequently arranged imaging optics 9, then no part beams which on passage through the plate stack have undergone at least one double reflection may contribute to the formation of the picture. Only the beams $T_1$ transmitted directly without reflection may get into the further beam path.

This however means that in the case of plates arranged in a compartment-like manner from the intensity ratio of the p-polarization to the s-polarization after transmission through a single plate one may extrapolate the intensity ratio after transmission through the whole plate stack in that one simple multiplies the individual ratios with one another.

Given the same conditions as with the above example (refractive index n=2; transmission of the s-polarization through a plate: 47%; transmission of the p-polarization: 100%) one may estimate that with a compartmented arrangement only 6 to 7 plates would be required in order to improve the above mentioned ratio to 100:1, in contrast to 88 plates with a uncompartmented plate stack.

Figure 4:
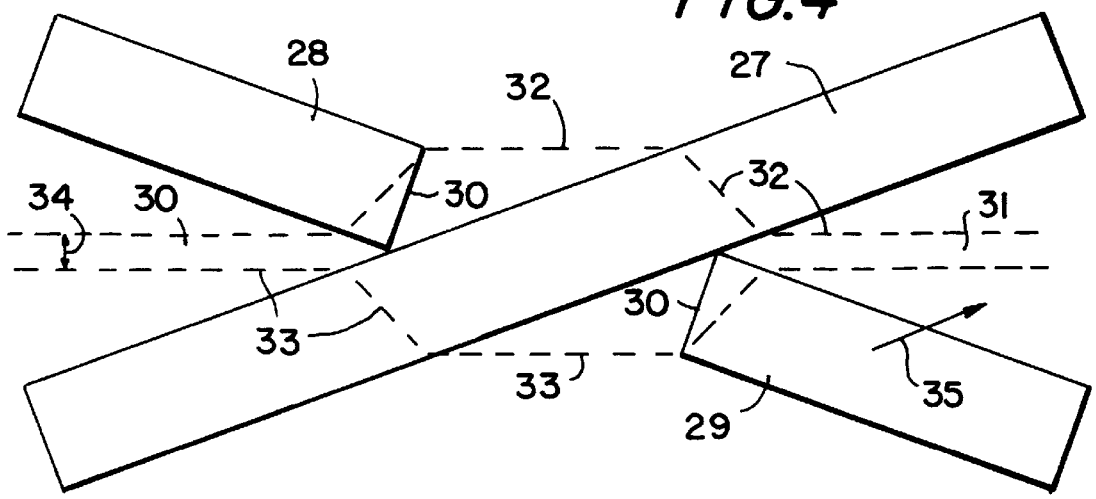
FIG. 4: plane-parallel plates in an X-shaped arrangement.
Figure 5:
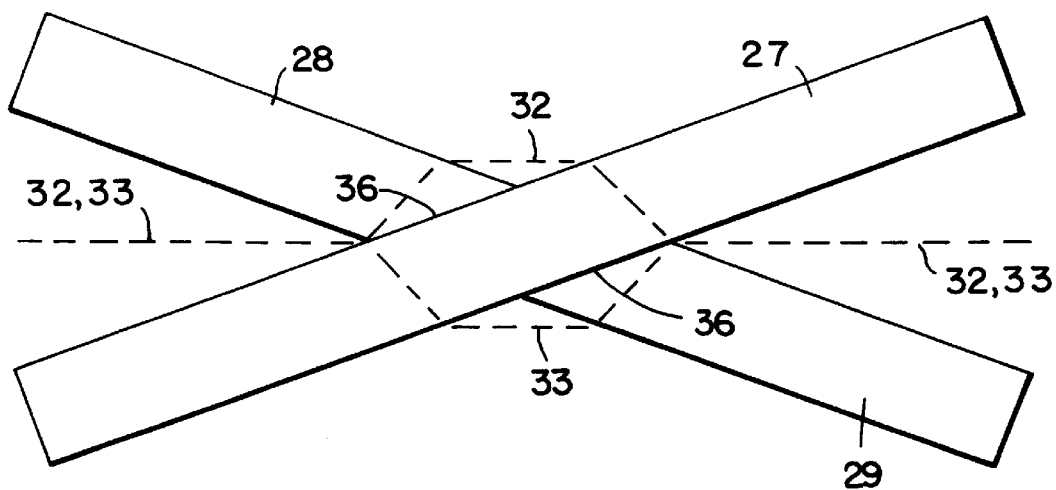
FIG. 5: as FIG. 4, with chamfered plate edges.

Principally one may achieve the same result with respect to the multiplication of the intensity ratios also with a modified plate arrangement which is represented in FIGS. 4 and 5.

The first plate 27 is set up in a known arrangement at the Brewster angle to the incident beams. This applies also to the second plate which however is subdivided into two plate parts 28 and 29. The one plate part 28 is at the same time arranged on the one side, the other plate part 29 on the other side of the plate so that in total an X-shaped arrangement arises.

This arrangement has the advantage that all plates 27, 28, 29 may be arranged exactly at the Brewster angle and thus offer the best conditions for a complete transmission of the p-polarization.

Since the two plate parts 28, 29 with the arrangement represented in FIG. 4 in the simplest case each have a straight cut narrow side 30 at the seam location at which the plate parts 28, 29 meet the first plate 27, there arises an opaque region 31. As one can recognise in the drawing by example of the border beams 32 and 33 just about passing through, the beams however by the refraction at the plates 27, 28, 29 are in an advantageous manner deflected around the seam location so that the thickness 34 of the opaque region is very much smaller than the plate thickness.

This thickness 34 may yet be reduced by half if one displaces the two plate parts 28, 29 parallel to one another as is indicated by the arrow 35 in the drawing.

One may also make the opaque region disappear completely if one provides the narrow sides of the two plate parts 28, 29 in each case with a chamfer 36 as is shown in FIG. 5.

The ratios are represented differently when instead of parallel light then convergent light is observed. Then specifically the angle of incidence of the light on a plane polarizer changes depending on the location.

Figure 6:
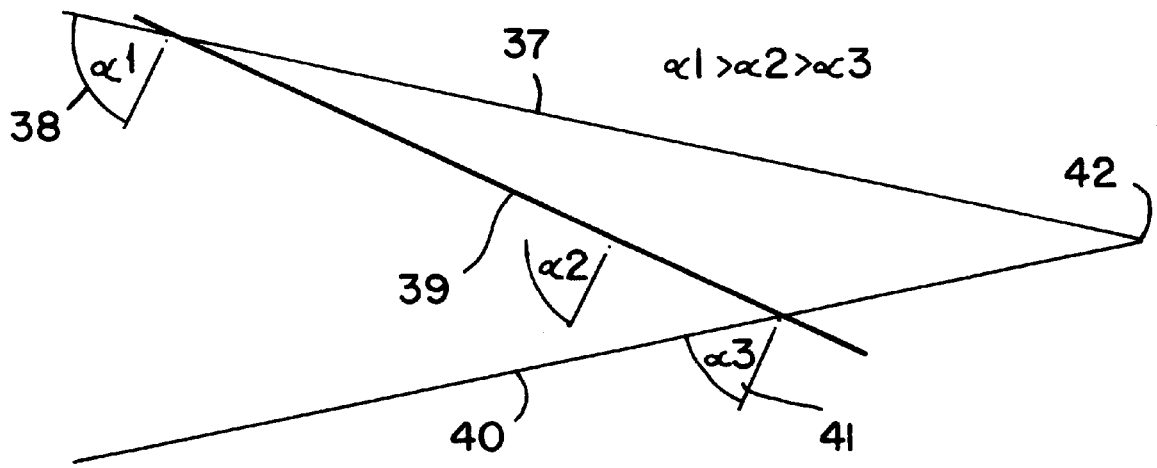
FIG. 6: a plane polarizer in convergent light.

These ratios are schematically represented in FIG. 6. An upper light beam 37 is incident with a different, i.e. larger angle 38 to the perpendicular of the surface of a plane polarizer 39 than a lower light beam 40. This strikes at a smaller angle 41 to the perpendicular of the surface in the direction of the focus. From this there results differing polarization effects.

Figure 7:
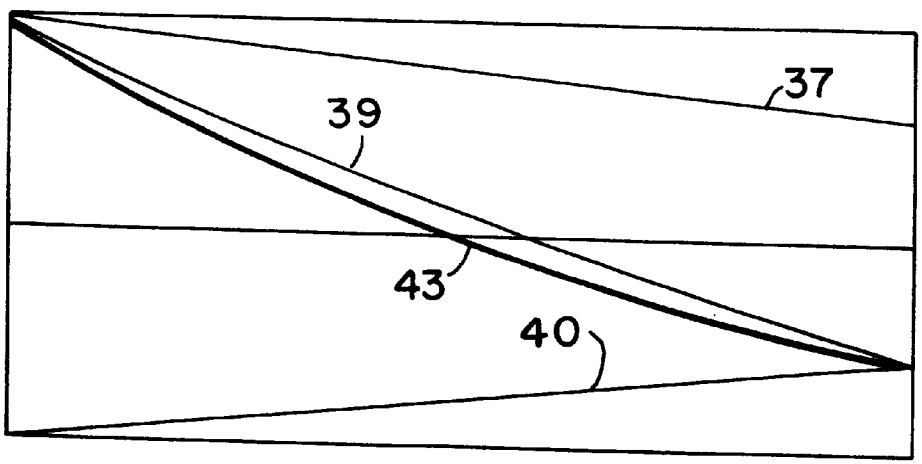
FIG. 7: an arcuate polarizer in convergent light.

In order to prevent this, according to the invention the polarizer is curved as is shown in FIG. 7 and is indicated with the reference numeral 43. For comparison the plane polarizer 39 is also shown in FIG. 7. With an arcuate polarizer whose curvature can be calculated by the man skilled in the art, all light beams independently of their location are incident at the same angle to the perpendicular of the surface. According to the requirements of the optics, the curvature may only be provided in one plane, as for example in the plane of the drawing, or also in two planes so that there results in an approximately spherical curvature. From placing opposite the plane polarizer 39 and the arcuate polarizer 40 in FIG. 7 it can also be recognized that the arcuate plate has a shortened installation length.

What is claimed is:

1. A polarizer for polarization of ultraviolet light with large apertures, the polarizer comprising light-permeable plates which are arranged at an angle to a light incident, said plates being inclined with respect to an optical axis in a same direction and in a stack, wherein an angle of incident light to a respective perpendicular of said plates lies in a region of a Brewster angle, said plates in a direction of the incident light being arranged progressively at reducing angles to the optical axis.

2. A polarizer as defined in claim 1, wherein said light-permeable plates are plane-parallel plates.

3. A polarizer as defined in claim 1, wherein said plates within said stack are arranged at slightly different angles in a compartmental manner.

4. A polarizer as defined in claim 1, wherein said plates comprise a wedge-shaped cross-section.

5. A polarizer as defined in claim 1, wherein said plates are arranged so that an angular difference of two neighboring plates is at least two degree.

6. A polarizer as defined in claim 5, wherein the angular difference of the two neighboring plates is between four degree and six degree.

7. A polarizer for polarization of ultraviolet light with large apertures, the polarizer comprising light-permeable plates arranged at an angle to a light incident, at least two of said plates being arranged inclined in opposite direction with respect to an optical axis so that respective perpendiculars of said plates are essentially at a Brewster angle to an optical axis, one of said two plates being divided into two plate parts, said two plate parts together with another undivided plate being arranged X-shaped.

8. A polarizer as defined in claim 7, wherein said plates are plane-parallel plates.

9. A polarizer as defined in claim 7, wherein said two plate parts are arranged out of a common plate plane toward the optical axis slightly parallel displaced.

10. A polarizer as defined in claim 7, wherein said two plate parts have narrow sides which lie nearest the individual plate and are provided with a chamfer.

11. A polarizer for polarization of ultraviolet light with large apertures, the polarizer comprising light-permeable plates which are arranged at an angle to a light incident, said plates being inclined with respect to an optical axis in a same direction and in a stack, wherein an angle of incident light to a respective perpendicular of said plates lies in a region of a Brewster angle, the polarizer having a curvature such that an angle of incidence of a light falling convergently onto at least one light permeable plate is formed roughly constant independent of a location.

12. A polarizer for polarization of ultraviolet light with large apertures, the polarizer comprising light-permeable plates arranged at an angle to a light incident, at least two of said plates being arranged inclined in opposite direction with respect to an optical axis so that respective perpendiculars of said plates are essentially at a Brewster angle to an optical axis, the polarizer having a curvature such that an angle of incidence of a light falling convergently onto at least one light permeable plate is formed roughly constant independent of a location.

* * * * *